US006236556B1

(12) United States Patent
Burleson et al.

(10) Patent No.: US 6,236,556 B1
(45) Date of Patent: May 22, 2001

(54) VARIABLE CAPACITOR TUNING APPARATUS

(75) Inventors: Mark H. Burleson; Marvin A. Weisbrod, both of San Jose, CA (US)

(73) Assignee: Jennings Technology, San Jose, CA (US)

( * ) Notice: Subject to any disclaimer, the term of this patent is extended or adjusted under 35 U.S.C. 154(b) by 0 days.

(21) Appl. No.: 09/358,879

(22) Filed: Jul. 22, 1999

(51) Int. Cl.[7] ....................................... H01G 5/38
(52) U.S. Cl. ........................... 361/299.4; 361/287
(58) Field of Search ........................... 361/277, 299.4, 361/287, 292, 290

(56) References Cited

U.S. PATENT DOCUMENTS 4,428,025   1/1984   King ................................. 361/274
5,590,015  12/1996   Planta et al. ..................... 361/277

FOREIGN PATENT DOCUMENTS 643 681      6/1984   (CH) .
656 740 A5   7/1986   (CH) .
2 076 224   11/1981   (GB) .

*Primary Examiner*—Anthony Dinkins
(74) *Attorney, Agent, or Firm*—Marshall, O'Toole, Gerstein, Murray & Borun

(57) ABSTRACT

A tuning head for use with a variable capacitor includes a coupler having a gap, a first optical fiber operatively coupled to the coupler, and a second optical fiber operatively coupled to the coupler. The first and second optical fibers are optically coupled across the gap when the gap is not obstructed. The tuning head further includes an obstruction member that is movable with respect to the coupler and is adapted to fit within the gap to selectively obstruct said optical coupling of said first and second optical fibers. A movement mechanism is also provided to create relative motion between said obstruction member and said coupler.

32 Claims, 5 Drawing Sheets

VARIABLE CAPACITOR TUNING APPARATUS

BACKGROUND OF THE INVENTION

The present invention is directed to a variable capacitor tuning apparatus, and more particularly to a variable capacitor tuning apparatus having an improved tuning head.

A known variable capacitor tuning arrangement 20 previously marketed by Jennings Technology, the owner of this patent, under, for example, model numbers CSVF/I-500-0315 or CVCJ/I-1000-0403 is shown in an exploded view in FIG. 1. The variable capacitor tuning arrangement 20 typically included a variable capacitor 22 and a tuning head 24. The tuning head 24 included a support thrust bearing 26, a sensor mount 28, an adjust plug 30, fiber optic connectors 34, 36 and a lead screw 40.

In implementing the known variable capacitor tuning arrangement 20, a customer would provide an actuator 44, a controller 46, an emitter 48 and a detector 50. In operation, the controller 46, would send commands to the actuator 44, which is a stepper motor. In response to the commands from the controller 46, the actuator 44, which is mechanically coupled to the tuning head 24 via the lead screw 40, would cause the tuning head 24 to change the capacitance of the variable capacitor 22. The tuning head 24 would change the capacitance of the variable capacitor 22 by meshing opposing conductive plates or cylinders to varying depths with respect to one another. The tuning head 24 would provide feedback to the controller 46 to indicate the position of the conductive plates or cylinders with respect to one another.

Referring now to the tuning head 24, the sensor mount 28 was fixed to the support thrust bearing 26. Both the sensor mount 28 and the adjust plug 30 had bores therein to accommodate the fiber optic cables (not shown) connected to the fiber optic connectors 34 and 36. The lead screw 40 extended into the support thrust bearing 26 and engaged the adjust plug 30 so that when the lead screw 40 was turned by the actuator 44, the adjust plug 30 moved closer to, or farther from, the top of the support thrust bearing 26 along the axis of the lead screw 40. The adjust plug 30 was, in turn, coupled to the variable capacitor 22 so that when the adjust plug 30 moved, due to lead screw 40 rotation, the capacitance of the variable capacitor 22 changed.

The emitter 48 provided optical energy to the fiber optic connector 34, which was fixed into the sensor mount 28. Optical energy that was coupled into the fiber optic connector 34 was transmitted to the detector 50, via the fiber optic connector 36 when the fiber optic cables associated with the fiber optic connectors 34 and 36 were aligned. In response to the optical energy, the detector 50 provided an electrical output signal to the controller 46. The vertical position of the adjust plug 30 along the lead screw 40 axis was adjusted so that the fiber optic cable associated with the fiber optic connector 36 was aligned with the fiber optic cable associated with the fiber optic connector 34 when the variable capacitor 22 was tuned to a capacitance value of interest.

The controller 46 was programmed to recognize the signal provided to it by the detector 50 when the fiber optic cables were aligned and optical energy was coupled to the detector 50. As the variable capacitor 22 was tuned away from the capacitance value of interest, the adjust plug 30 moved, the fiber optic cables associated with the fiber optic connectors 34 and 36 were no longer aligned, the detector 50 no longer received optical energy and changed the state of the signal that it provides to the controller 46. Accordingly, the controller 46 could determine whether or not the variable capacitor 22 was tuned to the capacitance value of interest based on the signals provided to it by the detector 50.

SUMMARY OF THE INVENTION

The present invention is directed to a variable capacitor tuning apparatus, and more particularly to a variable capacitor tuning apparatus having an improved tuning head.

According to a first aspect, the present invention may be embodied in a tuning head for use with a variable capacitor including a coupler. The coupler including a first coupler portion, a second coupler portion disposed at a first position relative to the first coupler portion, a gap between the first coupler portion and the second coupler portion, a first fiber locating structure associated with the first coupler portion, a second fiber locating structure associated with the second coupler portion and the first coupler portion fixed relative to the second coupler portion to maintain alignment of the first fiber locating structure and the second fiber locating structure. The tuning head also includes a first optical fiber supported by the first fiber locating structure, a second optical fiber supported by the second fiber locating structure, wherein the first and second optical fibers are optically coupled across the gap when the gap is not obstructed by an obstruction member movable with respect to the coupler and adapted to fit within the gap to selectively obstruct the optical coupling of the first and second optical fibers and a movement mechanism adapted to create relative motion between the obstruction member and the coupler to control selective obstruction of the gap by the obstruction member.

In some embodiments the first coupler portion is integral with the second coupler portion.

In some embodiments the obstruction member includes a transparent portion that does not obstruct the optical coupling of the first and second optical fibers when the transparent portion is within the gap, the transparent portion representing a capacitive set point of the variable capacitor. Additionally, the obstruction member may include an opaque portion that obstructs the optical coupling of the first and second optical fibers when the opaque portion is within the gap, the opaque portion representing a capacitive set point of the variable capacitor.

In other embodiments the obstruction member may include a plurality of transparent portions representing a plurality of capacitive set points of the variable capacitor. Additionally, the obstruction member may include a plurality opaque portions representing a plurality of capacitive set points of the variable capacitor.

According to a second aspect, the present invention may be embodied in a variable capacitor tuning system that includes a variable capacitor, an adjustment mechanism operatively coupled to the variable capacitor, the adjustment mechanism adapted to tune the variable capacitor, an actuator operatively coupled to the adjustment mechanism and adapted to interact with the adjustment mechanism to tune the variable capacitor and a coupler. The coupler having a first coupler portion, a second coupler portion disposed at a first position relative to the first coupler portion, a gap between the first coupler portion and the second coupler portion, a first fiber locating structure associated with the first coupler portion, a second fiber locating structure associated with the second coupler portion and the first coupler portion fixed relative to the second coupler portion to maintain alignment of the first fiber locating structure and the second fiber locating structure. The system may also include a first optical fiber supported by the first fiber locating structure, a second optical fiber supported by the second fiber locating structure, wherein the first and second optical fibers are optically coupled across the gap when the gap is not obstructed, an obstruction member movable with respect to the coupler and adapted to fit within the gap to selectively obstruct the optical coupling of the first and second optical fibers, a movement mechanism adapted to create relative motion between the obstruction member and the coupler to control selective obstruction of the gap by the obstruction member, an emitter optically coupled to the first optical fiber and a detector optically coupled to the second optical fiber.

According to a third aspect, the present invention may be embodied in a tuning head for use with a variable capacitor, wherein the tuning head includes a coupler having a gap and a plurality of fiber optic retaining members, a first optical fiber supported by the coupler, a second optical fiber supported by the coupler, wherein the first and second optical fibers are optically coupled across the gap when the gap is not obstructed, a first optical connector retained by a first one of the fiber optic retaining members and optically coupled to the first optical fiber, the first optical connector adapted to receive a first optical component, a second optical connector retained by a second one of the fiber optic retaining members and optically coupled to the second optical fiber, the second optical connector adapted to receive a second optical component, an obstruction member movable with respect to the coupler and adapted to fit within the gap to selectively obstruct the optical coupling of the first and second optical fibers and a movement mechanism adapted to create relative motion between the obstruction member and the coupler to control selective obstruction of the gap by the obstruction member.

According to a fourth aspect, the present invention may be embodied in a variable capacitor tuning system including a variable capacitor, an adjustment mechanism operatively coupled to the variable capacitor, the adjustment mechanism adapted to tune the variable capacitor, an actuator operatively coupled to the adjustment mechanism and adapted to interact with the adjustment mechanism to tune the variable capacitor, a coupler having gap and a plurality of fiber optic retaining members, a first optical fiber supported by the coupler, a second optical fiber supported by the coupler, wherein the first and second optical fibers are optically coupled across the gap when the gap is not obstructed, a first optical connector retained by a first of one of the fiber optic retaining members and optically coupled to the first optical fiber, a second optical connector retained by a second one of the fiber optic retaining members and optically coupled to the second optical fiber, an obstruction member movable with respect to the coupler and adapted to fit within the gap to selectively obstruct the optical coupling of the first and second optical fibers, a movement mechanism adapted to create relative motion between the obstruction member and the coupler to control selective obstruction of the gap by the obstruction member, an emitter optically coupled to the first optical connector and a detector optically coupled to the second optical connector.

According to a fifth aspect, the present invention may be embodied in a tuning head for use with a variable capacitor, wherein the tuning head includes a coupler having a gap, a first optical fiber supported by the coupler, a second optical fiber supported by the coupler, wherein the first and second optical fibers are optically coupled across the gap when the gap is not obstructed, an obstruction member movable with respect to the coupler and adapted to fit within the gap to selectively obstruct the optical coupling of the first and second optical fibers, wherein the obstruction member comprises a plurality of transparent portions and a plurality of opaque portions each representing a plurality of capacitive set points of the variable capacitor and a movement mechanism adapted to create relative motion between the obstruction member and the coupler.

According to a sixth aspect, the present invention may be embodied in a variable capacitor tuning system including a variable capacitor, an adjustment mechanism operatively coupled to the variable capacitor, the adjustment mechanism adapted to tune the variable capacitor, an actuator operatively coupled to the adjustment mechanism and adapted to interact with the adjustment mechanism to tune the variable capacitor, a coupler having a gap, a first optical fiber supported by the coupler, a second optical fiber supported by the coupler, wherein the first and second optical fibers are optically coupled across the gap when the gap is not obstructed, an obstruction member movable with respect to the coupler and adapted to fit within the gap to selectively obstruct the optical coupling of the first and second optical fibers, wherein the obstruction member comprises a plurality of transparent portions and a plurality of opaque portions each representing a plurality of capacitive set points of the variable capacitor and a movement mechanism adapted to create relative motion between the obstruction member and the coupler to control selective obstruction of the gap by the obstruction member, an emitter operatively coupled to the first optical fiber and a detector operatively coupled to the second optical fiber.

The features and advantages of the invention will be apparent to those of ordinary skill in the art in view of the detailed description of the preferred embodiment, which is made with reference to the drawings, a brief description of which is provided below.

DETAILED DESCRIPTION OF THE PREFERRED EMBODIMENTS

Figure 1:
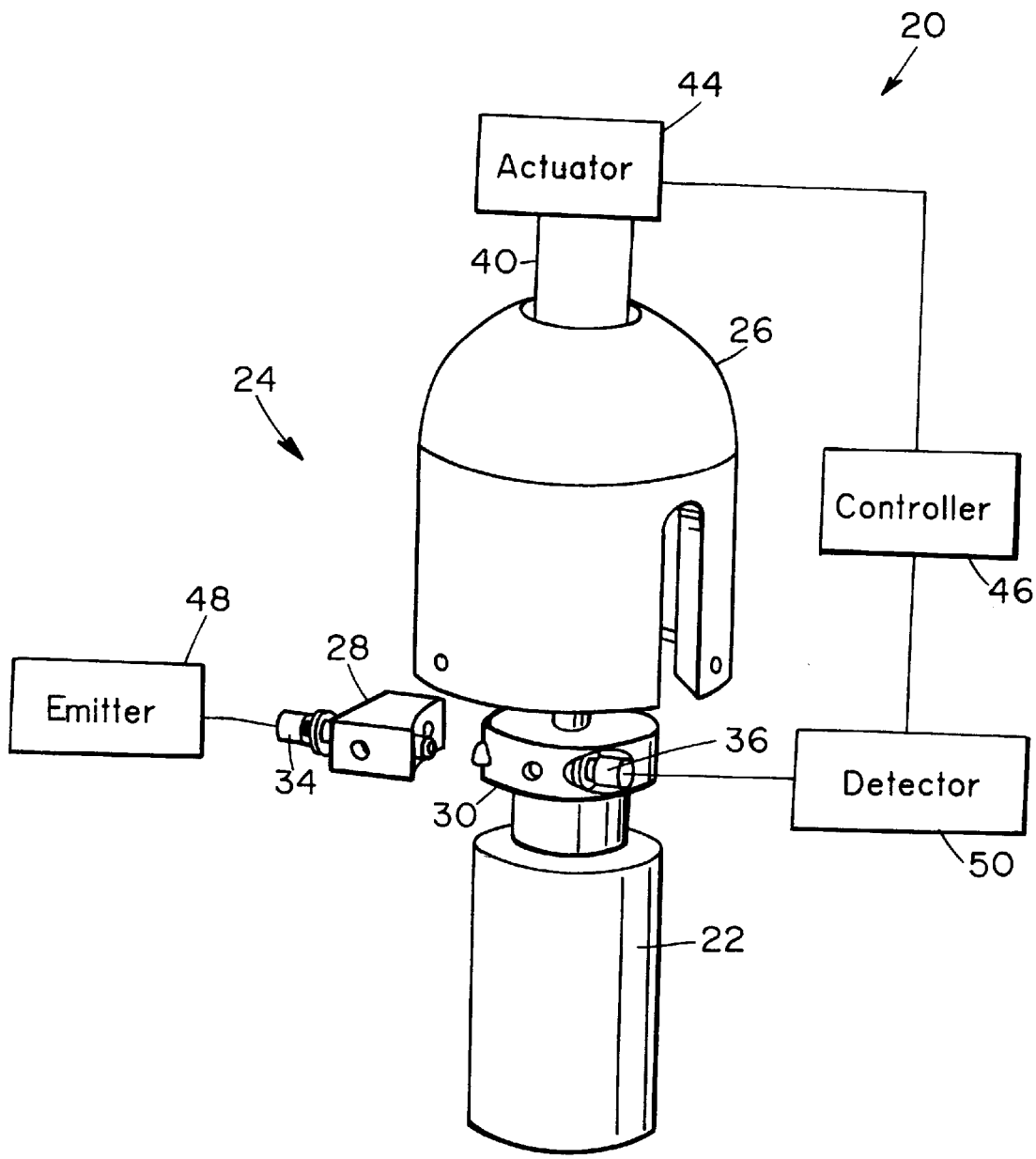
FIG. 1 is an exploded view of a known tuning head and variable capacitor tuning arrangement.
Figure 2:
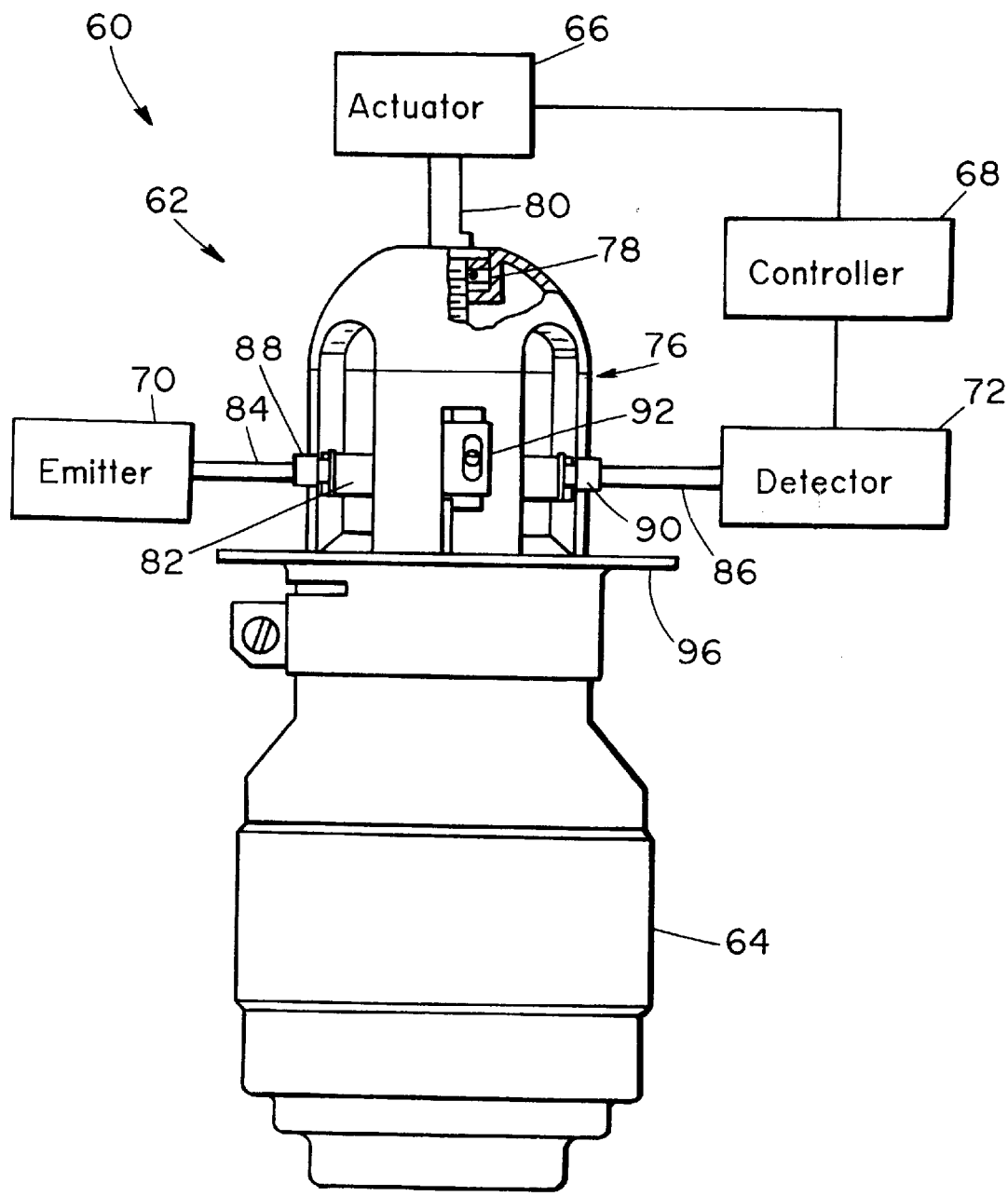
FIG. 2 is a side elevational view, partially in section, of a variable capacitor assembly having a tuning head designed in accordance with the teachings of the present invention.

FIG. 2 illustrates an embodiment of a variable capacitor tuning arrangement 60, designed in accordance with the teachings of the present invention, generally having a tuning head 62 and a variable capacitor 64. Also shown in FIG. 2 are an actuator 66, a controller 68, an emitter 70 and a detector 72. The tuning head 62 includes a support thrust bearing 76, a bearing assembly 78, an adjustment mechanism such as a lead screw 80, a coupler 82, fiber optic cables 84, 86, fiber optic connectors 88, 90, a flag 92, and an adjust plug (not shown). The support thrust bearing 76 is coupled to the variable capacitor 64 through a flange 96 and does not move with respect to the variable capacitor 64. The flag 92 serves as an obstruction mechanism that is inserted into the coupler 82. The coupler 82 is coupled to an adjust plug (designated as 122 in FIG. 3) and moves along the lead screw 80 with respect to the variable capacitor 64 when the lead screw 80 is turned to tune the variable capacitor 64. Together, the lead screw 80 and the adjust plug 122 form a movement mechanism that moves the coupler 82 with respect to the variable capacitor 64 when the lead screw 80 is turned.

Figure 3:
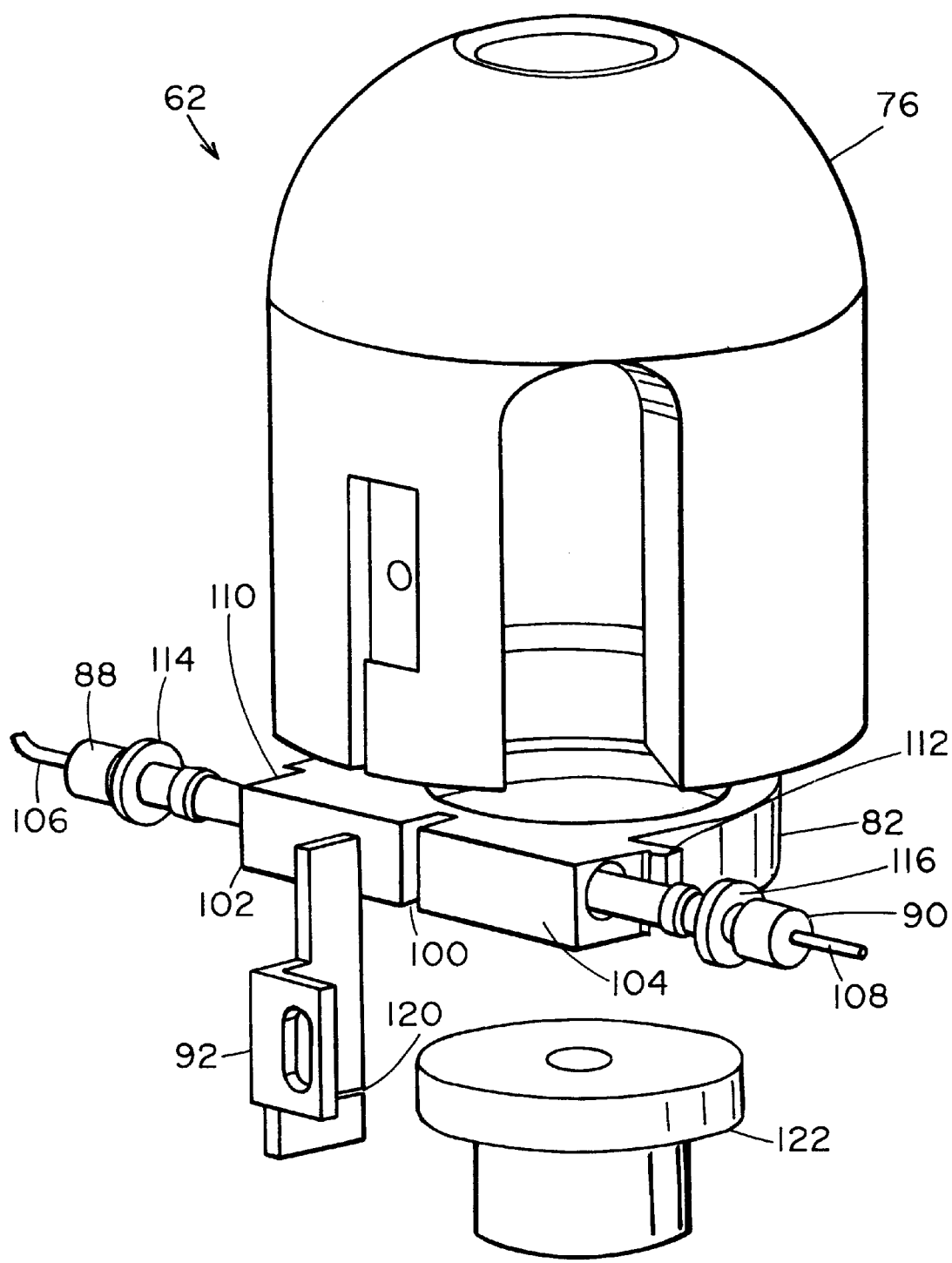
FIG. 3 is a exploded view of the tuning head shown in FIG. 2.

As shown in detail in FIG. 3, the coupler 82 includes a gap or slot 100 that divides the coupler 82 into first and second portions 102, 104. Although a slot 100 is shown, the gap could be a through hole or any other suitable structure. The first and second portions 102, 104 of the coupler 82 are machined to form first and second fiber locating structures. These structures are each adapted to receive fiber optic cable portions 106, 108 and include fiber optic retaining members or clips 110, 112 that engage flanges 114, 116 of the fiber optic connectors 88, 90. In one embodiment, the fiber optic connectors 88, 90 and their associated fiber optic cable portions 106, 108 may be fabricated from a standard fiber optic cable and connector assembly available from Hewlett Packard under model number HFBR-RNS5DM. When the fiber optic cable portions 106, 108 are fully inserted into the coupler 82, the flanges 114 and 116 will be retained by clips 110 and 112, respectively. This configuration is advantageous because it allows for quick and easy replacement of the fiber optic cable portions 106, 108 and their associated fiber optic connectors 88, 90 without the use of set screws or the like. When fully inserted into the coupler 82, the fiber optic cable portions 106, 108 abut the gap 100 and are adapted to couple optical energy across the gap 100 when the gap 100 is not obstructed. Further detail with regard to the coupler 82 may be found hereinafter with respect to FIG. 5.

The flag 92, which is mounted into the support thrust bearing 76 and may generally be termed an obstruction member, includes a removed or transparent portion 120. When the tuning head 62 is assembled, the coupler 82 is fastened onto the adjust plug 122 using a set screw or other appropriate fastening means, and the flag 92 is fastened onto the support thrust bearing 76. The support thrust bearing 76 is fastened onto the variable capacitor 64 (FIG. 2) over the coupler 82 and the adjust plug 122, such that the coupler 82 and the adjust plug 122 are free to move axially with respect to the variable capacitor 64 within the support thrust bearing 76. When the tuning head 62 is assembled, the flag 92 rides in the slot 100 and selectively obstructs optical energy produced by the emitter 70 as the coupler 82 moves with respect to the flag 92, thereby preventing the optical energy from reaching the detector 72.

A description of the operation of the tuning head 62 and the variable capacitor 64, along with the actuator 66, the controller 68, the emitter 70 and the detector 72 will now be given with reference to FIGS. 2 and 3. The emitter 70, which may be embodied in, for example, a Hewlett Packard model number T1512 infrared emitter, couples optical energy, via the fiber optic cable 84, to the fiber optic coupler 88 and the fiber optic cable portion 106 that is mounted in the first portion 102 of the coupler 82. The fiber optic cable portion 106 couples the optical energy up to the edge of the slot 100 in the first portion 102 of the coupler 82. On the opposite side of the slot 100, the fiber optic cable portion 108 is mounted in the second portion 104 of the coupler 82 and abuts the slot 100. The fiber optic cable portions 106, 108 are coaxially aligned with one another. The flag 92 fits into the slot 100 and the slot 100 moves axially with respect to the flag 92 as the variable capacitor 64 is tuned.

When the removed portion 120 of the flag 92 is in the slot 100 and is aligned with the fiber optic cable portions 106, 108, optical energy from the fiber optic cable portion 106 couples across the slot 100, into the fiber optic cable portion 108 and on further to the detector 72, which may be embodied in, for example, a Hewlett Packard model number R2521 infrared detector. However, when the coupler 82 is positioned such that the removed portion 120 is not aligned with the fiber optic cable portions 106, 108, optical energy will not couple across the slot 100 because the flag 92 obstructs the path of the optical energy. Although, the emitter 70 and the detector 72 are described as being of the infrared-type, one of ordinary skill in the art will readily recognize that other types of emitters or detectors (e.g., laser-type) may be used in accordance with the teachings of the present invention.

The optical detector 72, which is coupled to the fiber optic connector 90 via the fiber optic cable 86, detects the presence or absence of optical energy and develops an appropriate output signal. For example, when the removed portion 120 of the flag 92 is aligned with the fiber optic cable portions 106, 108, the optical detector 72, upon receiving optical energy may generate a "logic one." Conversely, when the removed portion 120 of the flag 92 is not aligned with the fiber optic cable portions 106, 108, the optical detector 72 may generate a "logic zero." In this case, the logic one signal indicates that the variable capacitor 64 is tuned to a particular capacitance value of interest because the centers of the fiber optic cable portions 106, 108 (and thus the upper capacitive plate of the capacitor 64, which is fixed relative to the fiber optic cable portions 106, 108) are in a particular axial position with respect to the removed portion 120 of the flag 92. Conversely, a logic zero indicates that the variable capacitor 64 is not tuned to a particular capacitance value of interest because there are many axial positions in which the fiber optic cable portions 106, 108 are not aligned with the removed portion 120 of the flag 92. The logic signals from the detector 72 are coupled to the controller 68 that appropriately interprets the signals.

While the above description indicates that the optical detector 72 generates a logic one signal when it receives optical energy, one skilled in the art will readily recognize that the sense of the output signal from the optical detector 72 may be inverted using, for example, standard Schmitt trigger inverter such as an 74HC14 device. In some embodiments, two such inverters may be used to buffer the output signal from the optical detector 72. Additionally, one skilled in the art will recognize that although the emitter 70 and the detector 72 are described as connected to optical fibers 84 and 86, respectively, it is possible to connect the emitter 70 to optical fiber 86 and the detector 72 to optical fiber 84, without departing from the teachings of the present invention.

Figures 4A, 4B, 4C:
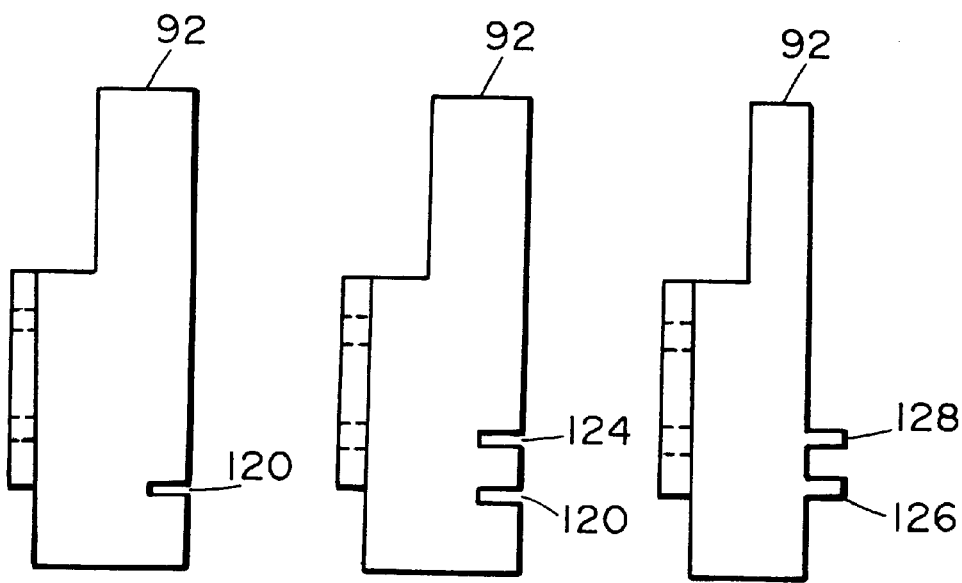
FIGS. 4a–4c are drawings of various flags or obstruction members that may be employed as shown in FIG. 3.

Although the flag 92 shown in FIG. 3 has only one removed portion 120, as shown in FIGS. 4a–4c, numerous types of flags 92 may be used in accordance with the teachings of the present invention. Flags 92 may have a single removed portion 120 or, optionally, may have an additional removed portion 124 or portions. Even though the flags shown in FIGS. 4a and 4b, show only one and two removed portions 120, 124, respectively, one of ordinary skill in the art will readily recognize that any number of removed portions may be used, wherein each removed portion corresponds to an axial position of the slot 100 with respect to the flag 92 and, therefore, corresponds to a particular capacitance value of interest to which the variable capacitor 64 is tuned.

The flags 92 shown in FIGS. 4a and 4b are premised on the concept that optical energy is normally blocked from the detector and, therefore, when optical energy is coupled to the detector, one of the removed portions 120, 124 must be aligned with the slot 100. However, a flag 92 may use upstanding or opaque portions to indicate particular capacitance values. A flag 92 as shown in FIG. 4c that has upstanding portions 126, 128 may be used to indicate a particular capacitance value to which the variable capacitor 64 is tuned. During operation, a system using a flag 92 having upstanding portions 126, 128 considers the presence of optical energy at the detector 72 to be not indicative of a particular capacitance value of interest because there are many axial positions in which optical energy will be present at the detector 72. Rather, an upstanding portion 126, 128 obstructing optical energy is indicative of a particular capacitance value of interest.

The use of multiple removed portions or multiple upstanding portions that correspond to particular capacitance values of interest is advantageous because it allows the controller 68 to automate the tuning of the variable capacitor 64 between various capacitance values using the actuator 66 as long as the controller 68 recalls the capacitance to which it is tuned. For example, if a detector 72 generates a logic one when it receives optical energy and if a flag 92 has four removed portions corresponding to, for example, 1.0 picofarad (pF), 10 pF, 100 pF, and 1000 pF, respectively, and the controller 28 recalls that the variable capacitor 64 is tuned currently to 10 pF, the controller 68 knows that by enabling the actuator 66 to tune the variable capacitor 64 down until the controller receives a logic zero and then a logic one, the variable capacitor 64 will be tuned to 1.0 pF. Similarly, if a flag 92 having four upstanding portions is used and the variable capacitor 64 is turned to 10 pF, the controller 68 knows that by tuning down the variable capacitor 64 that the variable capacitor 64 is turned to 1.0 pF when it receives a logic one and then a logic zero.

Although the flag 92 has been described as having either removed portions 120, 124 or upstanding portions 126, 128, these portions may be considered transparent and opaque, respectively. Transparent portions allow optical energy from the emitter 70 to reach the detector 72. Conversely, the opaque portions block optical energy and prevent it from reaching the detector 72. In certain embodiments, these portions may be upstanding or removed, while in other embodiments, these portions may be formed from glass, plastic or other like materials.

Figure 5:
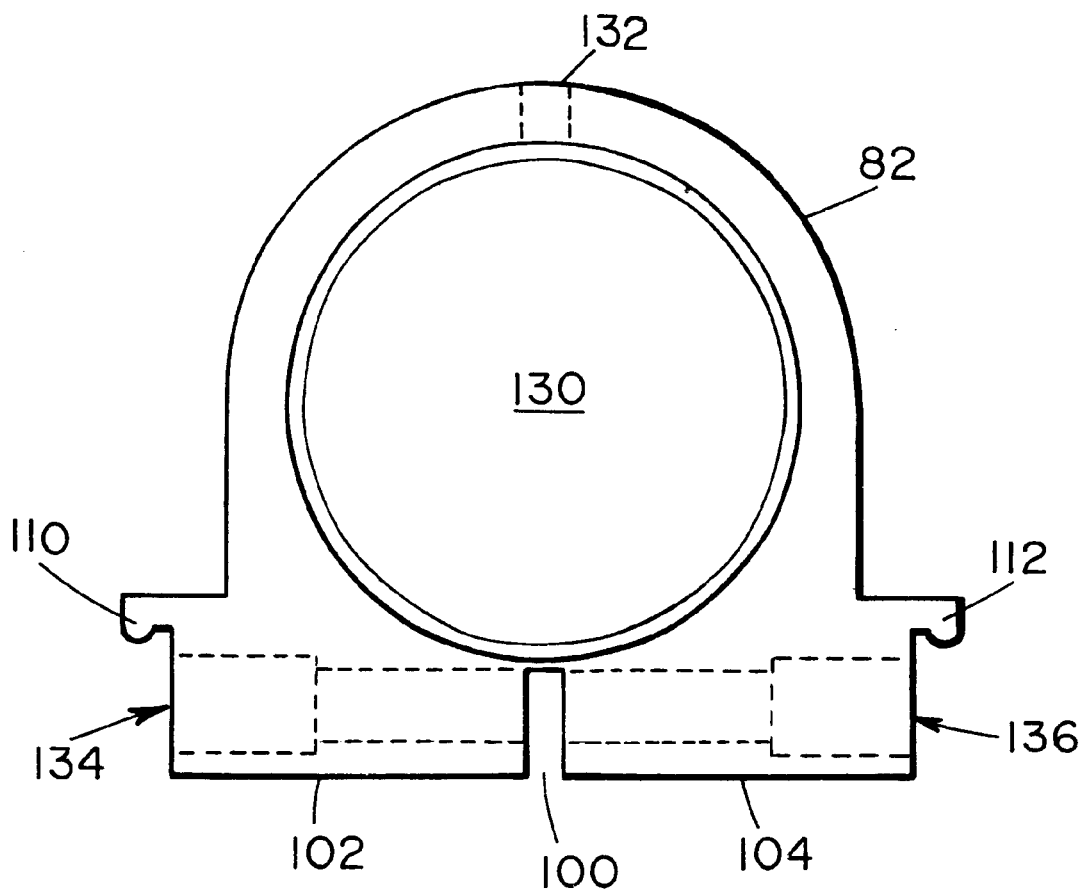
FIG. 5 is a plan view of the coupler shown in FIGS. 2 and 3.

Referring to FIG. 5, the coupler 82 includes the first and second portions 102 and 104, a center portion 130 adapted to receive the adjust plug 122, a set screw bore 132 adapted to receive a set screw that, when tightened, retains the adjust plug 122 within the center portion 130. The first and second portions 102 and 104 of the coupler 82 also include through holes 134 and 136, that accommodate the fiber optic connectors 88 and 90 and clips 110, 112 that engage the flanges 114, 116 of the fiber optic connectors 88, 90. As shown in FIG. 5, the through holes 134 and 136 extend up to the slot 100, thereby allowing the fiber optic cable portions 106, 108 of the fiber optic connectors 88 and 90 to abut the slot 100. Although the fiber locating structures are shown as through holes 134, 136 and clips 110, 112, those of ordinary skill in the art will recognize that such locating structures may be embodied in other configuration such as slots and the like.

Numerous additional modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A tuning head for use with a variable capacitor comprising:
   a coupler comprising;
      a first coupler portion;
      a second coupler portion disposed at a first position relative to said first coupler portion;
      a gap between said first coupler portion and said second coupler portion;
      a first fiber locating structure associated with said first coupler portion;
      a second fiber locating structure associated with said second coupler portion; and
      said first coupler portion fixed relative to said second coupler portion to maintain alignment of said first fiber locating structure and said second fiber locating structure;
   a first optical fiber supported by said first fiber locating structure;
   a second optical fiber supported by said second fiber locating structure, wherein said first and second optical fibers are optically coupled across said gap when said gap is not obstructed;
   an obstruction member movable with respect to said coupler and adapted to fit within said gap to selectively obstruct said optical coupling of said first and second optical fibers; and
   a movement mechanism adapted to create relative motion between said obstruction member and said coupler to control selective obstruction of said gap by said obstruction member.

2. A tuning head as defined in claim 1 wherein said first coupler portion is integral with said second coupler portion.

3. A tuning head as defined in claim 1 wherein said obstruction member includes a transparent portion that does not obstruct said optical coupling of said first and second optical fibers when said transparent portion is within said gap, said transparent portion representing a capacitive set point of a variable capacitor.

4. A tuning head as defined in claim 1 wherein said obstruction member includes an opaque portion that obstructs said optical coupling of said first and second optical fibers when said opaque portion is within said gap, said opaque portion representing a capacitive set point of a variable capacitor.

5. A tuning head as defined in claim 1 wherein said obstruction member comprises a plurality of transparent portions representing a plurality of capacitive set points of a variable capacitor.

6. A tuning head as defined in claim 1 wherein said obstruction member comprises a plurality opaque portions representing a plurality of capacitive set points of a variable capacitor.

7. A tuning head as defined in claim 1, wherein said movement mechanism is adapted to move said coupler.

8. A variable capacitor tuning system comprising:
   a variable capacitor;
   an adjustment mechanism operatively coupled to said variable capacitor, said adjustment mechanism adapted to tune said variable capacitor;
   an actuator operatively coupled to said adjustment mechanism and adapted to interact with said adjustment mechanism to tune said variable capacitor;

a coupler comprising;
  a first coupler portion;
  a second coupler portion disposed at a first position relative to said first coupler portion;
  a gap between said first coupler portion and said second coupler portion;
  a first fiber locating structure associated with said first coupler portion;
  a second fiber locating structure associated with said second coupler portion; and
  said first coupler portion fixed relative to said second coupler portion to maintain alignment of said first fiber locating structure and said second fiber locating structure;
a first optical fiber supported by said first fiber locating structure;
a second optical fiber supported by said second fiber locating structure, wherein said first and second optical fibers are optically coupled across said gap when said gap is not obstructed;
an obstruction member movable with respect to said coupler and adapted to fit within said gap to selectively obstruct said optical coupling of said first and second optical fibers;
a movement mechanism adapted to create relative motion between said obstruction member and said coupler to control selective obstruction of said gap by said obstruction member;
an emitter optically coupled to said first optical fiber; and
a detector optically coupled to said second optical fiber.

9. A variable capacitor tuning system as defined in claim 8 wherein said first coupler portion is integral with said second coupler portion.

10. A variable capacitor tuning system as defined in claim 8 wherein said obstruction member includes a transparent portion that does not obstruct said optical coupling of said first and second optical fibers when said transparent portion is within said gap, said transparent portion representing a capacitive set point of said variable capacitor.

11. A variable capacitor tuning system as defined in claim 8 wherein said obstruction member includes an opaque portion that obstructs said optical coupling of said first and second optical fibers when said opaque portion is within said gap, said opaque portion representing a capacitive set point of said variable capacitor.

12. A variable capacitor tuning system as defined in claim 8, wherein said movement mechanism is adapted to move said coupler.

13. A variable capacitor tuning system as defined in claim 8 wherein said obstruction member comprises a plurality of transparent portions representing a plurality of capacitive set points of said variable capacitor.

14. A variable capacitor tuning system as defined in claim 8 wherein said obstruction member comprises a plurality of opaque portions representing a plurality of capacitive set points of said variable capacitor.

15. A tuning head for use with a variable capacitor comprising:
a coupler having a gap and a plurality of fiber optic retaining members;
a first optical fiber supported by said coupler;
a second optical fiber supported by said coupler, wherein said first and second optical fibers are optically coupled across said gap when said gap is not obstructed;
a first optical connector retained by a first one of said fiber optic retaining members and optically coupled to said first optical fiber, said first optical connector adapted to receive a first optical component;
a second optical connector retained by a second one of said fiber optic retaining members and optically coupled to said second optical fiber, said second optical connector adapted to receive a second optical component;
an obstruction member movable with respect to said coupler and adapted to fit within said gap to selectively obstruct said optical coupling of said first and second optical fibers; and
a movement mechanism adapted to create relative motion between said obstruction member and said coupler to control selective obstruction of said gap by said obstruction member.

16. A tuning head as defined in claim 15 wherein said first optical component comprises an emitter.

17. A tuning head as defined in claim 15 wherein said second optical component comprises a detector.

18. A tuning head as defined in claim 15 wherein said obstruction member includes a transparent portion that does not obstruct said optical coupling of said first and second optical fibers when said transparent portion is within said gap, said transparent portion representing a capacitive set point of a variable capacitor.

19. A tuning head as defined in claim 15 wherein said obstruction member includes an opaque portion that obstructs said optical coupling of said first and second optical fibers when said opaque portion is within said gap, said opaque portion representing a capacitive set point of a variable capacitor.

20. A tuning head as defined in claim 15 wherein said obstruction member comprises a plurality of transparent portions representing a plurality of capacitive set points of a variable capacitor.

21. A tuning head as defined in claim 15 wherein said obstruction member comprises a plurality of opaque portions representing a plurality of capacitive set points of a variable capacitor.

22. A variable capacitor tuning system comprising:
a variable capacitor;
an adjustment mechanism operatively coupled to said variable capacitor, said adjustment mechanism adapted to tune said variable capacitor;
an actuator operatively coupled to said adjustment mechanism and adapted to interact with said adjustment mechanism to tune said variable capacitor;
a coupler having gap and a plurality of fiber optic retaining members;
a first optical fiber supported by said coupler;
a second optical fiber supported by said coupler, wherein said first and second optical fibers are optically coupled across said gap when said gap is not obstructed;
a first optical connector retained by a first of one of said fiber optic retaining members and optically coupled to said first optical fiber;
a second optical connector retained by a second one of said fiber optic retaining members and optically coupled to said second optical fiber;
an obstruction member movable with respect to said coupler and adapted to fit within said gap to selectively obstruct said optical coupling of said first and second optical fibers;
a movement mechanism adapted to create relative motion between said obstruction member and said coupler to control selective obstruction of said gap by said obstruction member;

an emitter optically coupled to said first optical connector; and a detector optically coupled to said second optical connector.

23. A variable capacitor tuning system as defined in claim 22 wherein said obstruction member includes a transparent portion that does not obstruct said optical coupling of said first and second optical fibers when said transparent portion is within said gap, said transparent portion representing a capacitive set point of said variable capacitor.

24. A variable capacitor tuning system as defined in claim 22 wherein said obstruction member includes an opaque portion that obstructs said optical coupling of said first and second optical fibers when said opaque portion is within said gap, said opaque portion representing a capacitive set point of said variable capacitor.

25. A variable capacitor tuning system as defined in claim 22 wherein said obstruction member comprises a plurality of transparent portions representing a plurality of capacitive set points of said variable capacitor.

26. A variable capacitor tuning system as defined in claim 22 wherein said obstruction member comprises a plurality of opaque portions representing a plurality of capacitive set points of said variable capacitor.

27. A tuning head for use with a variable capacitor comprising:

a coupler having a gap;

a first optical fiber supported by said coupler;

a second optical fiber supported by said coupler, wherein said first and second optical fibers are optically coupled across said gap when said gap is not obstructed;

an obstruction member movable with respect to said coupler and adapted to fit within said gap to selectively obstruct said optical coupling of said first and second optical fibers, wherein said obstruction member comprises a plurality of transparent portions and a plurality of opaque portions each representing a plurality of capacitive set points of a variable capacitor; and a movement mechanism adapted to create relative motion between said obstruction member and said coupler.

28. A tuning head as defined in claim 27 further comprising:

a first optical connector optically coupled to said first optical fiber, said first optical connector adapted to receive a first optical component; and a second optical connector optically coupled to said second optical fiber, said second optical connector adapted to receive a second optical component.

29. A tuning head as defined in claim 27, wherein said first optical component comprises an emitter.

30. A tuning head as defined in claim 27, wherein said second optical component comprises a detector.

31. A variable capacitor tuning system comprising:

a variable capacitor;

an adjustment mechanism operatively coupled to said variable capacitor, said adjustment mechanism adapted to tune said variable capacitor;

an actuator operatively coupled to said adjustment mechanism and adapted to interact with said adjustment mechanism to tune said variable capacitor;

a coupler having a gap;

a first optical fiber supported by said coupler;

a second optical fiber supported by said coupler, wherein said first and second optical fibers are optically coupled across said gap when said gap is not obstructed;

an obstruction member movable with respect to said coupler and adapted to fit within said gap to selectively obstruct said optical coupling of said first and second optical fibers, wherein said obstruction member comprises a plurality of transparent portions and a plurality of opaque portions each representing a plurality of capacitive set points of said variable capacitor; and a movement mechanism adapted to create relative motion between said obstruction member and said coupler to control selective obstruction of said gap by said obstruction member;

an emitter operatively coupled to said first optical fiber; and a detector operatively coupled to said second optical fiber.

32. A variable capacitor tuning system as defined in claim 31 wherein said movement mechanism moves said coupler.

* * * * *